(12) United States Patent
Kim et al.

(10) Patent No.: US 12,328,847 B2
(45) Date of Patent: Jun. 10, 2025

(54) CIRCUIT CARD ASSEMBLIES

(71) Applicant: AMETEK, INC., Berwyn, PA (US)

(72) Inventors: Joo-Han Kim, Huntsville, AL (US);
Brian Hoden, Albuquerque, NM (US);
Lucius Akalanne, Chippenham (GB)

(73) Assignee: AMETEK, INC., Berwyn, PA (US)

( * ) Notice: Subject to any disclaimer, the term of this patent is extended or adjusted under 35 U.S.C. 154(b) by 249 days.

(21) Appl. No.: 17/977,617

(22) Filed: Oct. 31, 2022

(65) Prior Publication Data
US 2023/0134978 A1 May 4, 2023

Related U.S. Application Data

(60) Provisional application No. 63/274,557, filed on Nov. 2, 2021.

(51) Int. Cl.
*H05K 7/20* (2006.01)
*H05K 1/02* (2006.01)
*H05K 7/14* (2006.01)

(52) U.S. Cl.
CPC ........... *H05K 7/205* (2013.01); *H05K 1/0204* (2013.01); *H05K 7/1418* (2013.01); *H05K 7/20281* (2013.01)

(58) Field of Classification Search
CPC ..... H05K 1/0203–0204; H05K 1/0209; H05K 7/20154; H05K 7/2029; H05K 7/20254;
(Continued)

(56) References Cited

U.S. PATENT DOCUMENTS 8,247,956 B2 * 8/2012 Liu .................. F21V 29/71
313/34
9,894,803 B1 * 2/2018 Artis .................. H05K 7/20409
(Continued)

FOREIGN PATENT DOCUMENTS

CN 112351650 A 2/2021
CN 214477410 U 10/2021
(Continued)

OTHER PUBLICATIONS

Turkish Search Report for Turkish Application No. 2022/016231, dated Oct. 31, 2023 with English translation, 6 pages.
(Continued)

*Primary Examiner* — Amir A Jalali
(74) *Attorney, Agent, or Firm* — Buchanan Ingersoll & Rooney PC

(57) ABSTRACT

A circuit card assembly comprising at least one electronic component that generates heat and a thermal management system the at least one electronic component is disclosed. The thermal management system comprises one or more phase change modules for distributing and storing heat; a metal frame in thermal contact with the at least one electronic component and having at least one opening for receiving the one or more phase change modules; and a heat transfer apparatus in thermal contact with one or more of the at least one electronic component and the metal frame. The heat transfer apparatus comprises at least one heat pipe and/or at least one heat spreader. The heat transfer apparatus provides a first heat transfer path during a period of reduced heat dissipation or cooling. The one or more phase change modules distributes and stores heat during the period of reduced heat dissipation or cooling.

30 Claims, 9 Drawing Sheets

(58) Field of Classification Search
CPC .......... H05K 7/20309–20318; H05K 7/20336; H05K 7/20245; H05K 7/20409; H05K 7/20418; H05K 7/20436; H05K 7/20509; H05K 7/20663; H05K 7/20881; H05K 7/209; H05K 7/20936; H05K 7/2099; H01L 23/345; H01L 23/36; H01L 23/427; H01L 23/4275; H01L 23/46; H01L 23/473; H01L 23/34; H01L 23/3677; H01L 23/3733; H01L 2023/405; G06F 1/20; G06F 1/203; F28D 15/00; F28D 15/02; F28D 15/04; F28D 15/0233; F28D 15/046; F28D 15/0275; B23P 15/26; B23P 2700/09; B23P 2700/10
See application file for complete search history.

(56) References Cited

U.S. PATENT DOCUMENTS

| | | | |
|---|---|---|---|
| 11,968,806 B2* | 4/2024 | Kitamura | G06F 1/203 |
| 2007/0210082 A1 | 9/2007 | English et al. | |
| 2009/0129020 A1* | 5/2009 | Fujiwara | G06F 1/203 |
| | | | 361/697 |
| 2009/0284923 A1 | 11/2009 | Rytka et al. | |
| 2009/0323276 A1* | 12/2009 | Mongia | G06F 1/203 |
| | | | 361/679.52 |
| 2011/0277967 A1* | 11/2011 | Fried | F28D 15/0266 |
| | | | 165/104.26 |
| 2014/0151014 A1* | 6/2014 | Zhang | H01L 23/427 |
| | | | 165/206 |
| 2017/0318710 A1 | 11/2017 | De Bock et al. | |
| 2018/0042139 A1* | 2/2018 | Rosales | H05K 7/20436 |
| 2018/0068926 A1 | 3/2018 | Krajniak et al. | |
| 2019/0116691 A1* | 4/2019 | Bozorgi | H01L 23/427 |
| 2020/0053908 A1* | 2/2020 | Engelhardt | H05K 7/20509 |
| 2020/0100388 A1 | 3/2020 | Hernandez-Toledo | |
| 2020/0396864 A1* | 12/2020 | Ku | H05K 7/20309 |
| 2021/0055770 A1 | 2/2021 | Kim et al. | |
| 2021/0289669 A1* | 9/2021 | Yurchenko | H05K 7/20409 |
| 2022/0354020 A1* | 11/2022 | Purpus | H01Q 1/28 |
| 2022/0400582 A1* | 12/2022 | Lin | G06F 1/203 |
| 2023/0069684 A1* | 3/2023 | Kitamura | H05K 7/2039 |
| 2023/0217631 A1* | 7/2023 | Kojima | F28D 15/0233 |
| | | | 361/700 |

FOREIGN PATENT DOCUMENTS

| | | |
|---|---|---|
| WO | 0120713 A1 | 3/2001 |
| WO | 2013163166 A1 | 10/2013 |
| WO | 2016077619 A1 | 5/2016 |
| WO | 2018026484 A1 | 2/2018 |

OTHER PUBLICATIONS

Great Britain Combined Search & Examination Report for Application No. GB2212225.3, dated Apr. 28, 2023, 6 pages.
Spanish Search Report for Spanish Application No. 202230875, dated Apr. 18, 2023 with translation, 11 pages.
Tan, F. L. et al.: "Thermal Management of Mobile Phone using Phase Change Material", 2007 9th Electronics Packaging Technology Conference, 20071210 IEEE, Piscataway, NJ, pp. 836-842.

* cited by examiner

CIRCUIT CARD ASSEMBLIES

CROSS-REFERENCE TO RELATED APPLICATION

This application claims priority from U.S. Provisional Application Ser. No. 63/274,557, titled "CIRCUIT CARD ASSEMBLIES," filed Nov. 2, 2021, incorporated herein by reference in its entirety and for all purposes.

TECHNICAL FIELD

The present invention relates generally to circuit card assemblies, and more particularly, circuit card assemblies comprising thermal management systems and methods, for management of transient thermal performance issues via use of integrated phase change modules.

BACKGROUND

Operation of electronic devices or assemblies requires proper thermal management and maintenance of electronic components (e.g., integrated circuits, circuit boards, circuit modules, processors, memory, disk drives, etc.). The electronic components typically generate heat during operation or are comprised of electronic components that generate heat. As the heat from the electronic device(s) builds, the electronic device or assembly may suffer from overheating, operational failure, degradation, other forms of thermal or mechanical stresses, or combinations thereof.

Such thermal stresses may be especially problematic or unmanageable for systems requiring (i) multiple electronic components, (ii) maximum processing or computing power, and/or (iii) specialized or harsh operating environments (e.g. aerospace, defense, extreme temperatures, high vibration, high altitudes, abrupt high-G/acceleration, hypersonic speed, etc.). These systems may suffer from transient thermal performance issues related to temperature fluctuations, intermittent power peaks, and temporary loss of cooling. Some examples include (1) exceeding junction temperature limits, resulting in significant computing performance (down-clocking or derating), (2) die temperature spikes/fluctuations, (3) non-functional heat pipe/liquid cooling (e.g. dryout), or a combination thereof. Failure to mitigate or resolve these transient thermal performance issues can lead to an inability to maintain electronic components in safe and reliable functioning conditions, which may cause or contribute to failures or performance degradations during normal or steady-state system operation.

Thus, there remains a need to provide alternative or improved circuit card assemblies having thermal management systems and methods that can provide more efficient cooling and/or heat dissipation, while minimizing temperature fluctuations during phase transition and/or mitigating or preventing decline of thermal performance during normal steady-state operating conditions.

SUMMARY

Aspects of the present invention are directed to circuit card assemblies comprising thermal management systems and methods.

In one exemplary aspect, there is provided a thermal management system for a heat source comprising at least one electronic component. The thermal management system comprises one or more phase change modules comprising phase change material for distributing and storing heat; a metal frame in thermal contact with the at least one electronic component and having at least one opening for receiving the one or more phase change modules; and a heat transfer apparatus in thermal contact with one or more of the at least one electronic component and the metal frame, the heat transfer apparatus providing a first heat transfer path.

In another exemplary aspect, there is provided a circuit card assembly. The circuit card assembly comprises a circuit board having at least one electronic component that generates heat; one or more phase change modules comprising phase change materials for distributing and storing heat; a metal frame coupled to the circuit board and in thermal contact with the at least one electronic component, the metal frame further having at least one opening for receiving the one or more phase change modules; and a heat transfer apparatus in thermal contact with one or more of the at least one electronic component and the metal frame, the heat transfer apparatus providing a first heat transfer path.

In another exemplary aspect, there is provided a method of manufacturing a circuit card assembly comprising at least one electronic component that generates heat. The method comprises (a) forming at least one opening in a metal frame for receiving the at least one electronic component; (b) forming at least one opening in the metal frame for receiving one or more phase change modules, the one or more phase change modules comprising phase change material for distributing and storing heat; (c) filling the at least one opening with the one or more phase change modules; and (d) attaching a metal layer over the at least one opening for containing the one or more phase change modules within the at least one opening of the metal frame.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be omitted. In addition, according to common practice, the various features of the drawings are not drawn to scale unless otherwise indicated, and the dimensions of the various features may be expanded or reduced for clarity. Included in the drawings are the following figures.

DETAILED DESCRIPTION

The thermal management systems disclosed herein are usable for electronic components associated with circuit card assemblies (CCA), including for CCA used in specialized or harsh operating environments (e.g. aerospace, defense, extreme temperatures, high vibration, high altitudes, abrupt high-G/acceleration, hypersonic speed, etc.). While the thermal management systems are described herein with respect to electronic components associated with circuit card assemblies (CCA), it will be understood that the invention is not so limited. To the contrary, aspects of the present invention are usable in applications or products in which it is desirable to manage or stabilize the thermal energy (heat or temperature) of electronic components.

As used herein, the term "circuit card assembly" comprises electronic components or other electronics units that generate heat (of varying degrees) or require heat dissipation or cooling. In an exemplary embodiment, a circuit card assembly may comprise semiconductor products, such as field-programmable gate array (FPGA) sets, central processing units (CPU), and graphics processing units (GPU). In another exemplary embodiment, a circuit card assembly may comprise a circuit board having high power semiconductor products, processors, or other electrical components with the circuit board coupled to a heat frame. The term "heat frame" may include any electronic housing, unit, housing, frame, rack, compartment adapted to house, contain, or enclose (partially or entirely; fixed or removable) circuit boards and/or electronic components.

Figure 1:
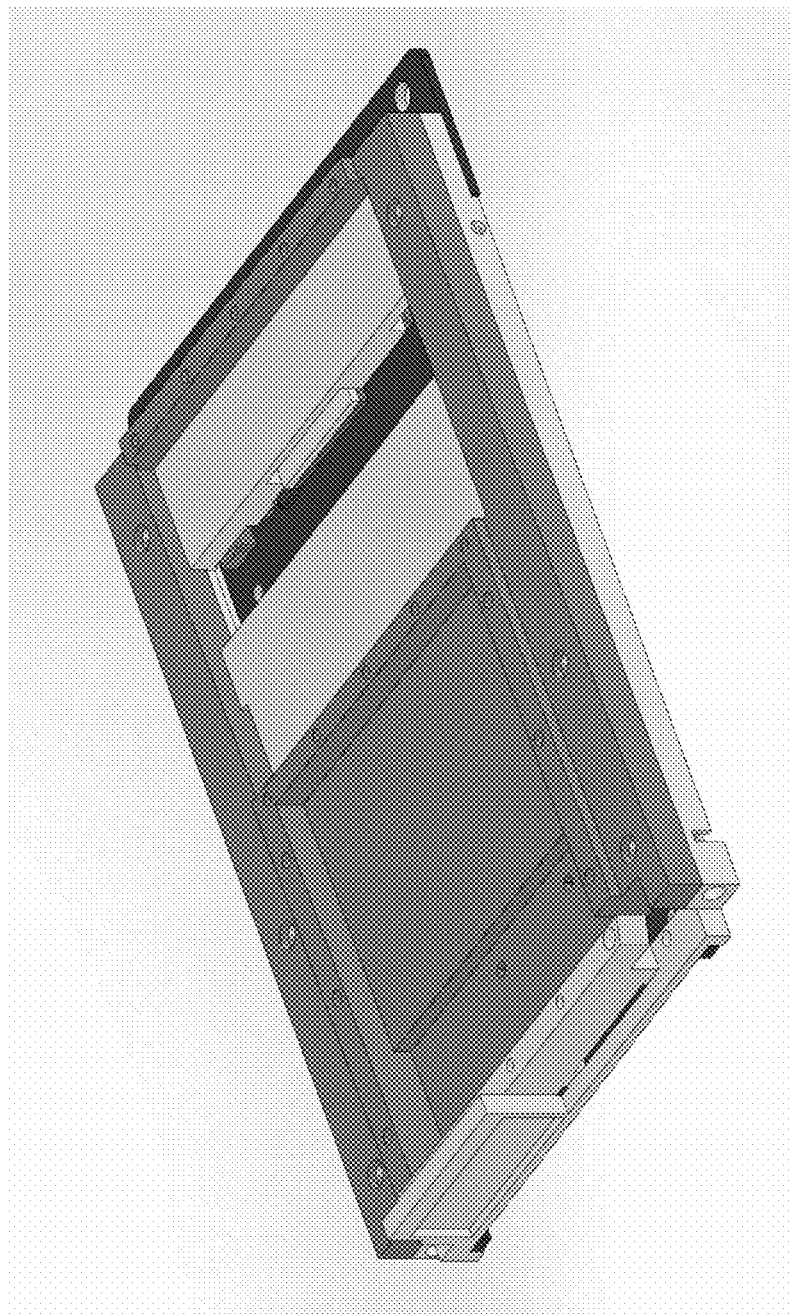
FIG. 1 depicts an exemplary circuit card assembly.
Figure 2:
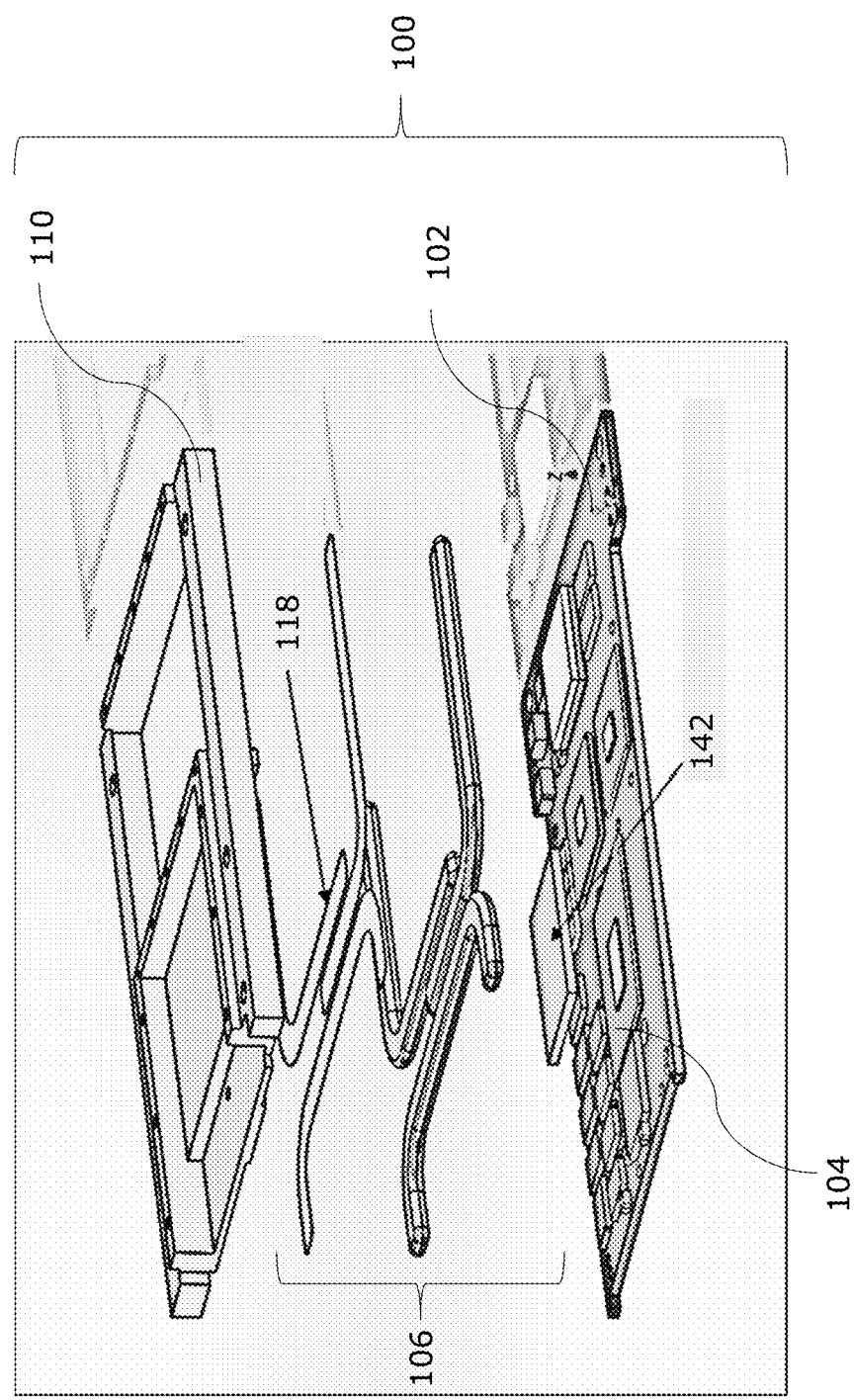
FIG. 2 is an exploded view of the circuit card assembly shown in FIG. 1

With reference to the drawings, FIGS. 1 and 2 illustrate an exemplary circuit card assembly, such as a circuit card assembly 100. In general, circuit card assembly 100 includes at least one electronic component 104, a heat transfer apparatus 106, and one or more phase change modules 108. In an exemplary embodiment, circuit card assembly 100 comprises a circuit board 102 having at least one component that generates heat, such as electronic component 104. Coupled to the circuit board 102 is a metal frame 110, which is positioned in circuit card assembly 100, such that metal frame 110 is in thermal contact with electronic component 104. To this end, metal frame 110 may have a size, shape, and/or surface contours configured to correspond to one or more components of circuit card assembly 100, such as heat transfer apparatus 106 and electronic component 104. Further, metal frame 110 may comprise metal having a satisfactory heat or thermal conductivity, such as aluminum, copper, or alloys thereof (e.g. aluminum or copper alloys).

Metal frame 110 further includes at least one opening 112 (e.g. a pocket) for receiving one or more phase change modules 108. Phase change modules 108 comprise phase change material for distributing and storing heat generated by electronic component 104. In an exemplary embodiment, phase change modules 108 are configured for distributing and storing heat during a period of reduced heat dissipation or cooling. This period of reduced heat dissipation or cooling may be due to operating conditions such as high altitude, high acceleration, hypersonic speed, intermittent computing power, or a combination thereof.

To facilitate and/or manage this distribution and/or storage of heat from electronic component 104, circuit card assembly 100 includes heat transfer apparatus 106. In an exemplary embodiment, heat transfer apparatus 106 is comprised of at least one heat pipe 118 (FIG. 2). Heat pipe 118 is positioned relative to electronic component 104 and metal frame 110, such that heat pipe 118 is in thermal contact with one or more of electronic components 104 and metal frame 110. In this configuration, heat pipe 118 provides a heat transfer path 114 for the heat generated by electronic component 104. In an exemplary embodiment, heat transfer path 114 is provided during the period of reduced heat dissipation or cooling. Further, heat transfer path 114 may be different from another heat transfer path 116 during a period of standard/normal steady-state heat dissipation or cooling.

In another exemplary embodiment, heat transfer apparatus 106 is comprised of at least one heat spreader 142, such as a metal (e.g. copper or copper alloy) plate (FIG. 2). Heat spreader 142 is positioned relative to electronic component 104 and metal frame 110, such that heat spreader 142 is in thermal contact with one or more electronic components 104 and metal frame 110. In this configuration, heat spreader 142 provides a heat transfer path 144 for the heat generated by the CCA or components thereof, such as electronic component 104. In an exemplary embodiment, heat transfer path 144 is provided during the period of reduced heat dissipation or cooling. Further, heat transfer path 144 may be different from another heat transfer path during a period of standard/normal steady-state heat dissipation or cooling, such as heat transfer path 116.

In yet another exemplary embodiment, heat spreader 142 is additionally or optionally comprised of an oscillating heat pipe 136 (FIG. 8) embedded therein. At least one oscillating heat pipe 136 is positioned relative to one or more of electronic component 104 and metal frame 110, such that oscillating heat pipe 136 is in thermal contact with one or more of electronic components 104 and metal frame 110. In this configuration, oscillating heat pipe 136 provides a heat transfer path, such as heat transfer path 144, for the heat generated by electronic component 104. In an exemplary embodiment, the heat transfer path 144 is provided during the period of reduced heat dissipation or cooling. Further, the heat transfer path 144 may be different from another heat transfer path during a period of standard/normal steady-state heat dissipation or cooling, such as heat transfer path 116.

Figure 3:
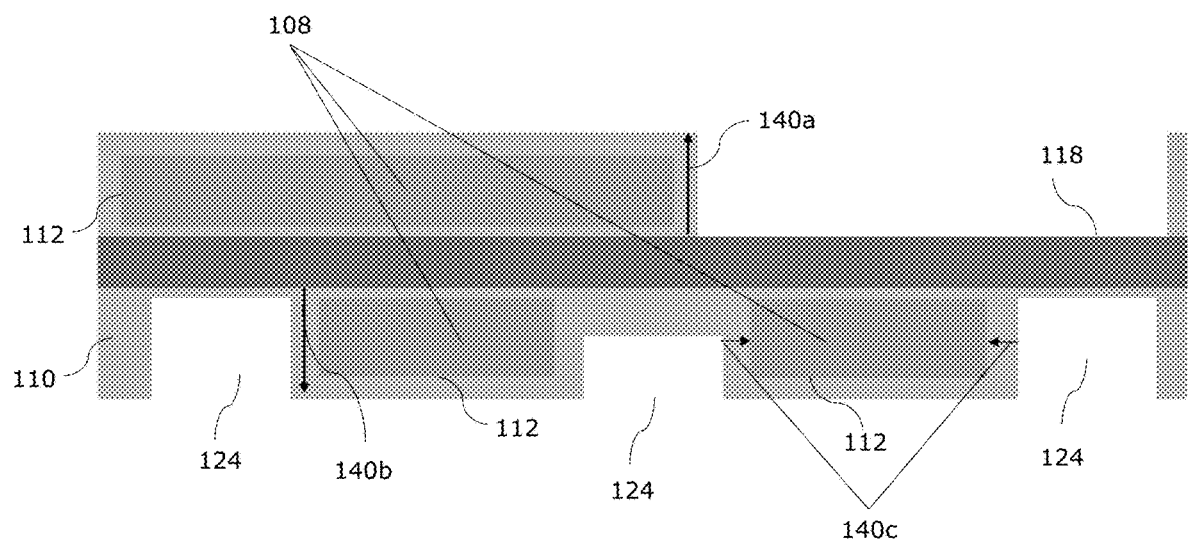
FIG. 3 depicts a portion of the circuit card assembly shown in FIG. 1.

Referring now to FIGS. 2 and 3, an exemplary heat pipe 118 is disposed adjacent to metal frame 110, such that phase change modules 108 embedded in metal frame 110 may be disposed above (as shown by arrow 140a in FIG. 3), below (as shown by arrow 140b in FIG. 3), or on one or more sides (as shown by arrow 140c) of heat pipe 118. Desirably, at least one opening or pocket 112 of metal frame 110 may be defined in metal frame 110 Opening or pocket 112 is configured to receive a respective phase change module 108, such that opening or pocket 112 has a size and shape sufficient to receive a respective phase change module 108.

Still further, in this configuration, phase change modules 108 may be in thermal contact with electronic component 104 because as is illustrated in FIG. 3, phase change modules 108 embedded in metal frame 110 may be disposed above (as shown by arrow 140a in FIG. 3), below (as shown by arrow 140b in FIG. 3), and/or on one or more sides (as shown by arrow 140c in FIG. 3) of at least one pocket 124. At least one pocket 124 of metal frame 110 is configured for respectively receiving a component of circuit card assembly 100 that generates heat, such as electronic component 104.

Desirably, embedding phase change modules 108 within a portion of metal frame 110, such that phase change modules 108 are in thermal contact with one or more of metal frame 110 and electronic component 104, as described above, allows for improved management of transient thermal performance issues (as will be discussed below). Further, embedding a phase change material like that used in phase change modules 108 within a portion of metal frame 110 does not interfere with operation of heat pipe 118 (which provides heat transfer path 116) during normal steady-state conditions.

Turning now to FIGS. 4A-4D and 5, an exemplary method of manufacturing a portion of circuit card assembly 100, such as method 500, is disclosed. Details of method 500 are set forth below with respect to the elements of exemplary circuit card assembly 100. In particular, method 500 comprises steps for embedding phase change modules 108 within metal frame 110, as was described above.

Figure 4B:
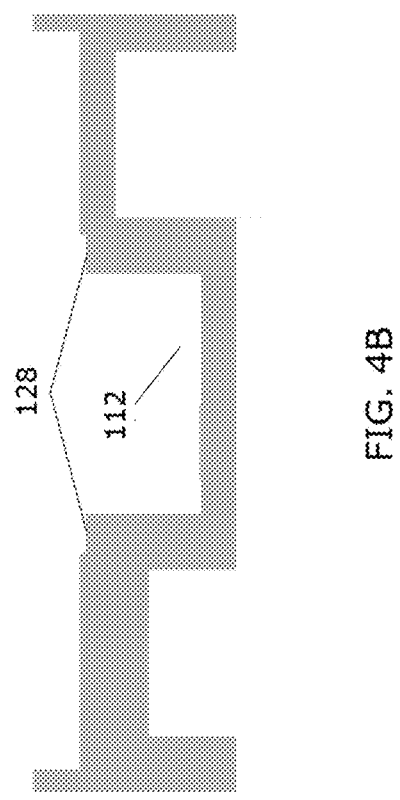
FIGS. 4A-4D depict the stages formed from an exemplary method of manufacturing the portion of the circuit card assembly shown in FIG. 3.
Figure 4D:
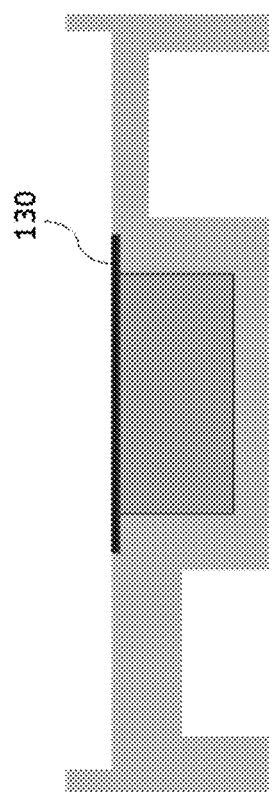
Figure 4A:
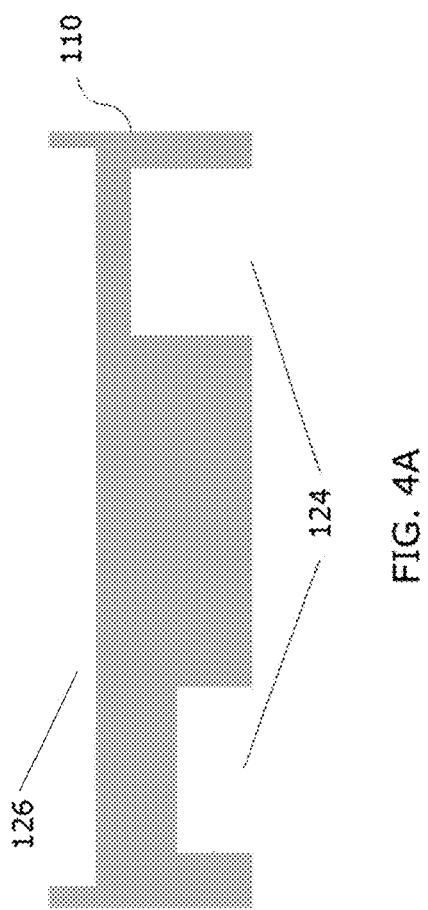
Figure 4C:
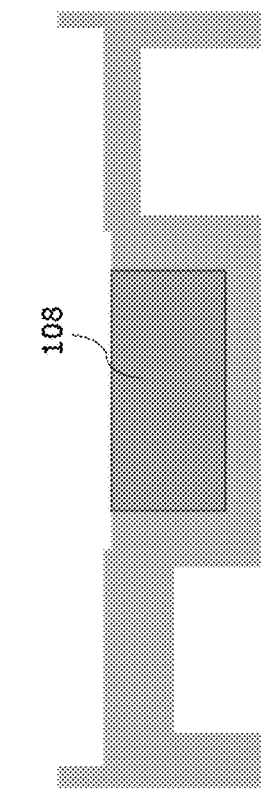
Figure 5:
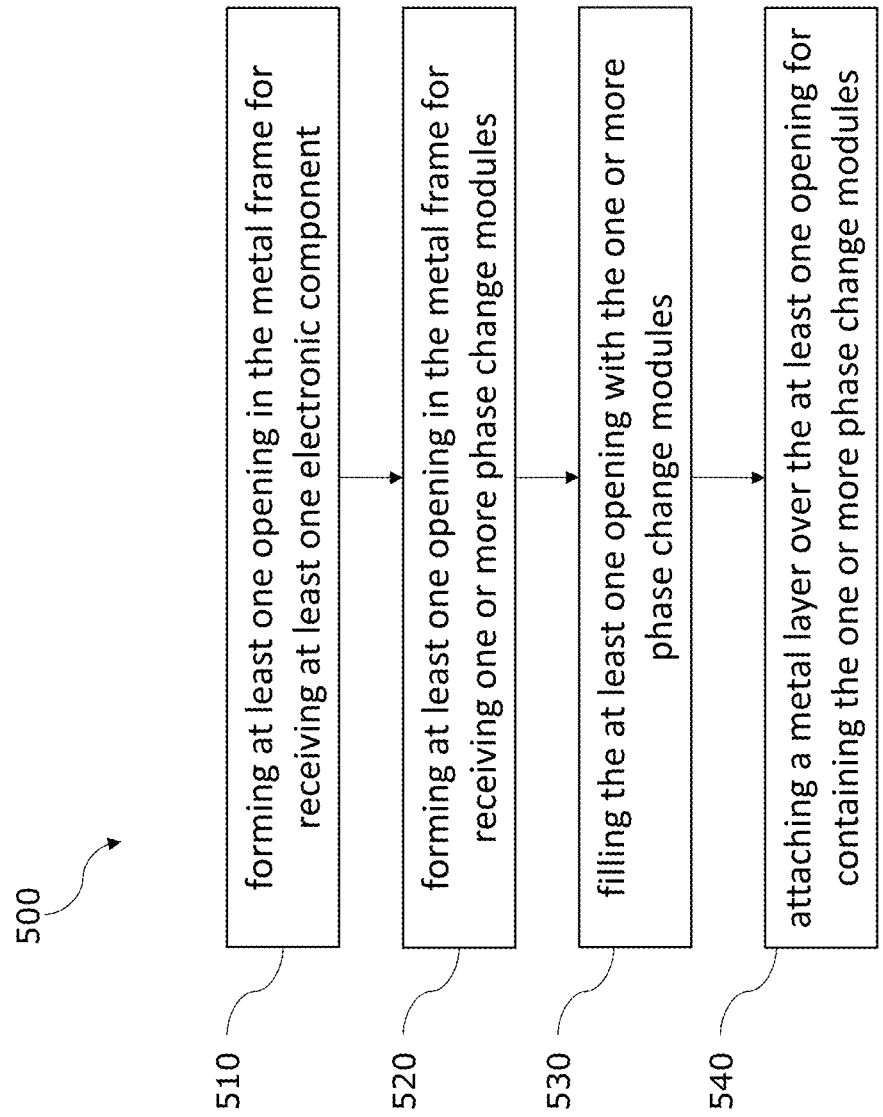
FIG. 5 is a flow diagram showing the method steps used in stages shown in FIGS. 4A-4D.

Specifically, as illustrated in FIGS. 4A-4D and the flow diagram in FIG. 5, method 500 comprises a step 510 of forming at least one opening in a metal frame, such as opening or pocket 124 in metal frame 110, for receiving electronic component 104. Still further, in an exemplary embodiment, method 500 also includes a step of forming at least one groove 126 (FIG. 4A) in metal frame 110 for contacting a surface of a heat transfer apparatus, such as heat transfer apparatus 106.

Groove 126 is formed, such that heat transfer apparatus 106 comprising heat pipe 118 is in thermal contact with electronic components 104 and/or metal frame 110. Specifically, groove 126 is formed, such that heat pipe 118 is disposed at least partially within groove 126. In this configuration, heat transfer apparatus 106 comprising heat pipe 118 provides a first heat transfer path, such as path 114. In an exemplary embodiment, path 114 is used during a period of reduced heat dissipation or cooling. Additionally or optionally, first heat transfer path 114 is different from a second heat transfer path, such as path 116 (as shown in FIG. 6B), which is provided during a period of standard/normal steady-state heat dissipation or cooling.

The heat transfer path during steady-state operation, such as path 116, provides a generally higher thermal conduction path through heat pipe 118, relative to other components of circuit card assembly 100, for example. In general, heat pipes are two-phase heat transfer devices that utilize evaporation and condensation of working fluid to outperform any solid/metal heat conduction. For example, heat pipes can usually achieve higher thermal conductivity than copper. Accordingly, heat pipe 118, through which path 116 is provided, performs essentially as a thermal superconductor, such that negligible heat is transferred along other thermal paths. Thus, heat pipe 118 is the dominant/primary heat transfer path during normal steady-state operation.

However, during a period of reduced/loss of cooling or heat dissipation, heat pipe 118 may become less effective due to condensation loss or dryout, for example. In an exemplary embodiment, this period of reduced heat dissipation or cooling may be due to operating conditions such as high altitude, high gravitational force (G-force), high acceleration, hypersonic speed, intermittent peaks of computing power usage, or a combination thereof. During this period of reduced heat dissipation or cooling, temperature starts to increase and heat pipe 118, through which path 116 is provided, becomes less effective. Thus, in such an embodiment, heat pipe 118 becomes a secondary heat transfer path (i.e. no longer the dominant or primary heat transfer path). Accordingly, a heat transfer or thermal path that is different from path 116, such as heat path 114, becomes the dominant or primary heat transfer path. Phase change modules 108 are desirably located along heat transfer path 114 in order to distribute and/or store heat. Thus, path 114 becomes the dominant or primary heat transfer path at predetermined melting points when phase change modules 108 start to absorb heat, while maintaining their temperature constant for a certain period of time. In this way, temperature fluctuations during phase transitions are minimized and/or declines of thermal performance during steady-state conditions are mitigated or prevented, such that circuit card assemblies 100 comprising electronic component 104 can be maintained in reliable working condition.

As illustrated in FIG. 4B and the flow diagram in FIG. 5, method 500 also includes a step 520 of forming at least one opening 112 in metal frame 110 for receiving phase change modules 108. In an exemplary embodiment of circuit card assembly 100, opening 112 of metal frame 110 comprises a T-shaped pocket. The opening 112 may include a pair of ledges 128 to receive a portion of metal layer 130.

As stated above, phase change modules 108 comprise phase change material for distributing and storing heat from electronic component 104. In an exemplary embodiment, phase change modules 108 are configured to distribute and store heat away from at least electronic component 104 during the period of reduced heat dissipation or cooling.

As illustrated in FIG. 4C and the flow diagram in FIG. 5, method 500 further comprises a step 530 of filling opening or pocket 112 with phase change modules 108. Pocket 112 is filled with phase change modules 108, such that embedded phase change modules 108 in metal frame 110 are disposed above (as shown by arrow 140a in FIG. 3), below (as shown by arrow 140b in FIG. 3), and/or on one or more sides (as shown by arrow 140c in FIG. 3) of heat pipe 118.

As shown in FIG. 4D and the flow diagram in FIG. 5, method 500 also includes a step 540 of attaching metal layer 130 over pocket 112 for containing phase change modules 108 within pocket 112 of metal frame 110. Specifically, metal layer 130 may act as a lid or cover configured for engagement with ledges 128 of pocket 112 (FIG. 4B). Still further, in an exemplary embodiment, metal layer 130 may comprise copper and may be disposed over pocket 112 of metal frame 110 by soldering, brazing, welding or thermal epoxy.

Figure 6A:
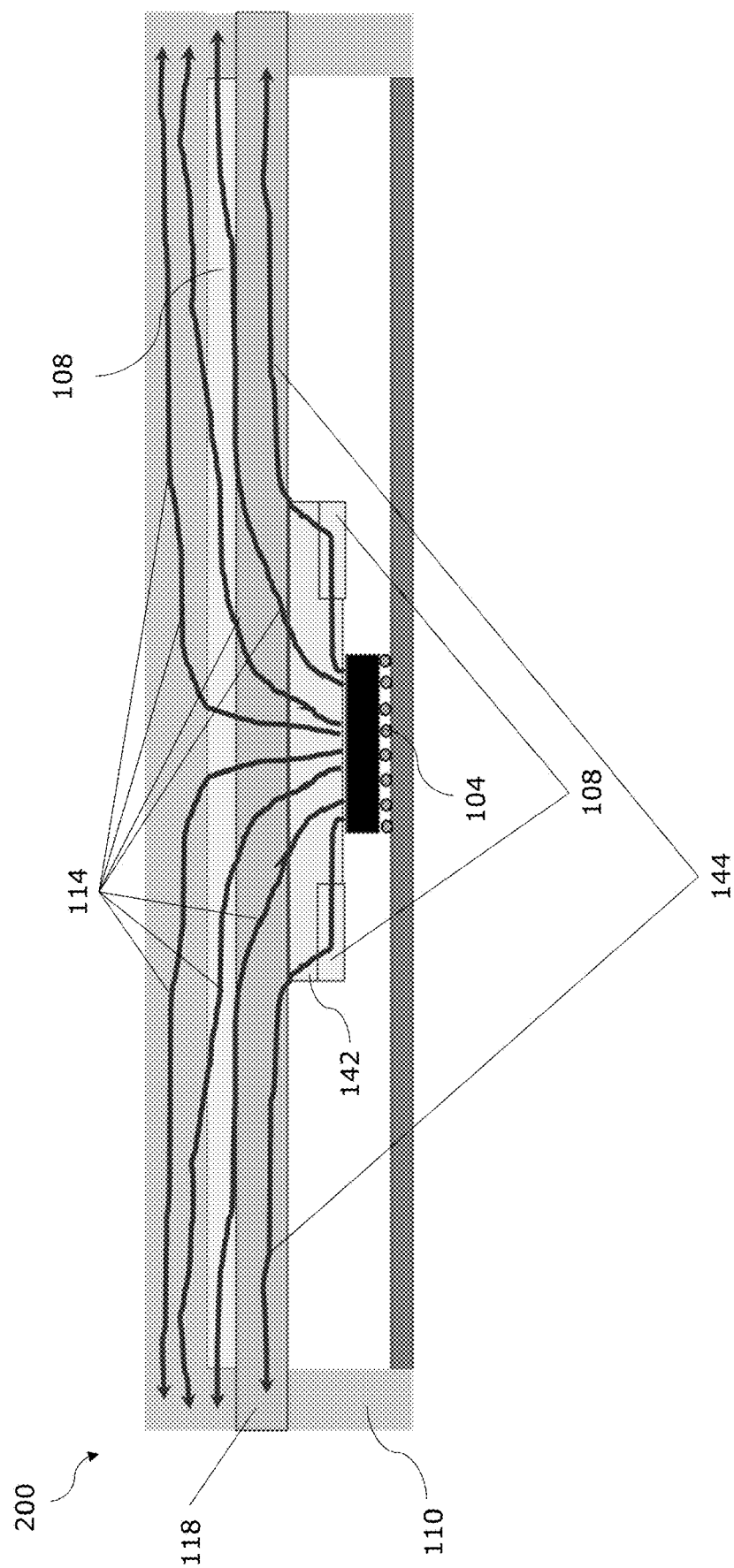
FIG. 6A depicts an exemplary thermal management system, showing an exemplary heat transfer apparatus providing a heat transfer path during a period of reduced heat dissipation or cooling.
Figure 6B:
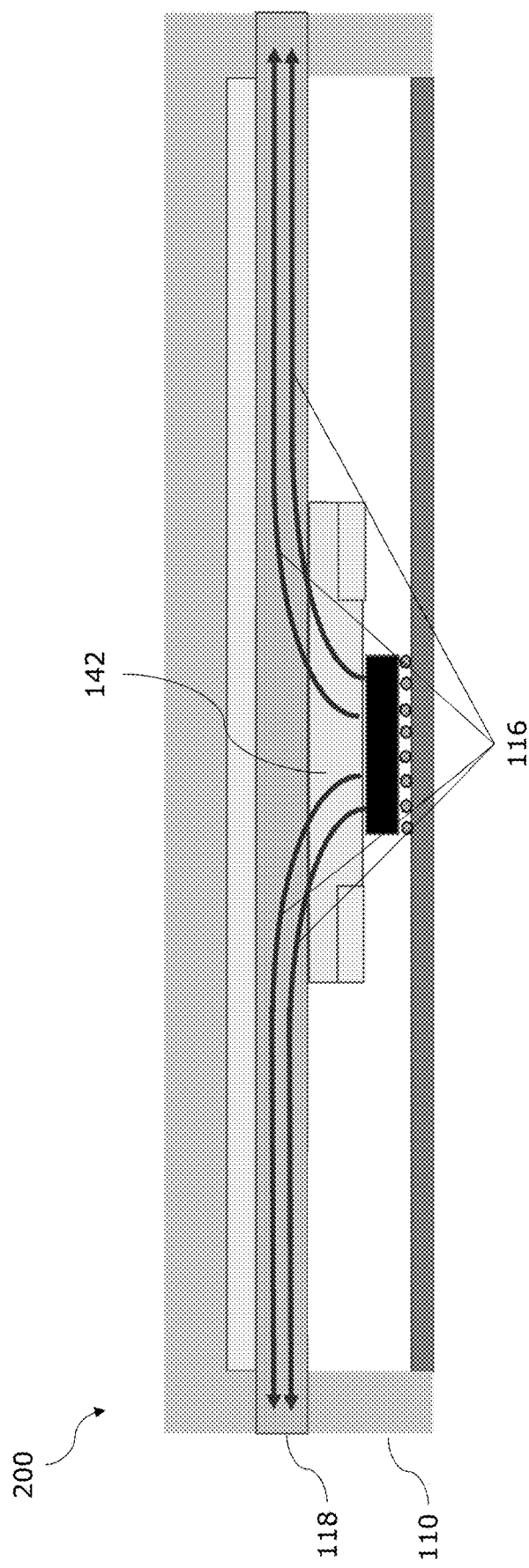
FIG. 6B depicts the thermal management system shown in FIG. 6A, showing another heat transfer path during a period of standard steady-state heat dissipation or cooling.

Referring now to FIGS. 6A-6B, as circuit card assembly 100 becomes heated or undergoes other forms of thermal stresses, circuit card assembly 100 may require management of the thermal performance to remain within operating parameters/specifications. In an exemplary embodiment, exemplary thermal management system 200 comprising phase change modules 108 that are integrated within metal frame 110 and/or heat transfer apparatus 106, serves to perform that management function. Thermal management system 200 is discussed further below and with reference to the components of circuit card assembly 100.

In an exemplary embodiment, thermal management system 200 is configured to manage a heat source comprising at least one electronic component, such as electronic component 104. Thermal management system 200 comprises phase change modules, such as phase change modules 108 discussed above. Phase change modules 108 comprise phase change material for distributing and/or storing heat from electronic component 104. Metal frame, such as metal frame 110 is in thermal contact with electronic component 104. Metal frame 110 includes at least one opening, such as pocket 112, for receiving phase change modules 108. A heat transfer apparatus, such as heat transfer apparatus 106, is also in thermal contact with electronic component 104 and/or metal frame 110. Heat transfer apparatus 106 is configured for providing a first heat transfer path. Additional details of the individual components of thermal management system 200 and operation thereof are discussed below.

Metal frame 110 may comprise a metal having a satisfactory heat or thermal conductivity, such as aluminum, copper, or alloys thereof (e.g. aluminum or copper alloys). In an exemplary embodiment, opening 112 of metal frame 110 may comprise a pocket, such as a T-shaped pocket having a pair of ledges 128 (as shown in FIG. 4B) to receive a lid or cover, such as metal layer 130. Metal layer 130 may comprise metal, such as copper, and may be disposed over at least one opening 112 by soldering, brazing, welding or thermal epoxy.

Phase change modules 108 is configured for distributing and/or storing heat during a period of reduced heat dissipation or cooling. This period of reduced heat dissipation or cooling may arise because of or in relation to operating conditions comprising high altitude, high acceleration, hypersonic speed, intermittent computing power, or a combination thereof. Such operating conditions may lead to transient thermal issues that require management of heat from electronic component 104 via thermal management system 200.

To achieve this, thermal management system 200 includes heat pipe 118. Heat pipe 118 is disposed adjacent metal frame 110, such that phase change modules 108 embedded in metal frame 110 are disposed above (as shown by arrow 140a in FIG. 3), below (as shown by arrow 140b in FIG. 3), and/or on one or more sides (as shown by arrow 140c in FIG. 3) of heat pipe 118. In an exemplary embodiment, heat pipe 118 is configured to provide a first heat transfer path 114 during the period of reduced heat dissipation or cooling (FIG. 6A). Further, the first heat transfer path 114 may be different from a second heat transfer path 116, which is provided by heat transfer apparatus 106 during a period of standard steady-state heat dissipation or cooling (FIG. 6B). Details of the first transfer path 114 and second transfer path 116 are now discussed below.

As shown in FIG. 6A, circuit card assembly 100 includes electronic component 104. Electronic component 104 generates heat, thereby requiring thermal management to reduce or eliminate the risk of operational failure and/or other undesirable effects of thermal stresses. The cooling of or dissipation of this heat from electronic component 104 during the period of reduced heat dissipation or cooling is indicated by first heat transfer path 114. As explained above, cooling or heat dissipation of electronic component 104 is provided by path 114 because heat pipe 118 provides generally higher thermal conductivity relative to other components of circuit card assembly 100. Such path 114 is indirectly or directly determined by at least the position and configuration of phase change modules 108 relative to one or more of metal frame 110, electronic component 104, and heat apparatus 106. In the exemplary embodiment shown in FIG. 6A, heat from electronic component 104 is distributed and/or stored (via path 114) through heat pipe 118 and through metal frame 110 having embedded phase change modules 108.

In contrast, as illustrated in FIG. 6B, cooling or heat dissipation of electronic component 104 during the period of standard/normal steady-state heat dissipation or cooling is indicated by second heat transfer path 116. Second heat transfer path 116 is different from first heat transfer path 114, at least because heat transfer path 116 indicates heat from electronic component 104 is distributed/dissipated or stored through heat pipe 118 during standard/normal steady-state conditions. Thus, heat transfer path 114 involving use of phase change modules 108 replaces heat transfer path 116 along heat pipe 118 as the primary or dominant heat transfer path during the period of reduced heat dissipation or cooling.

In this way, inclusion of phase change modules 108 in thermal management system 200 of circuit card assembly 100 has a neutral effect on or at least does not negatively affect normal/standard steady-state heat dissipation or cooling. Thus, first heat transfer path 114 provides an added advantage to thermal management of circuit card assembly 100. Further, thermal management system 200 comprising first heat transfer path 114 and second heat transfer path 116 provides more efficient cooling and/or heat dissipation because path 114 is configured to minimize temperature fluctuations during phase transition and path 116 is configured to mitigate or prevent decline of thermal performance during normal steady-state operating conditions.

Figure 7B:
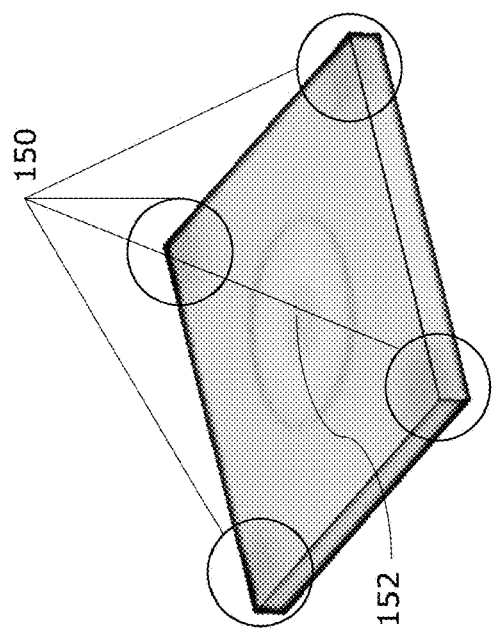
FIG. 7A-7B depict another embodiment of an exemplary heat transfer apparatus.
Figure 7A:
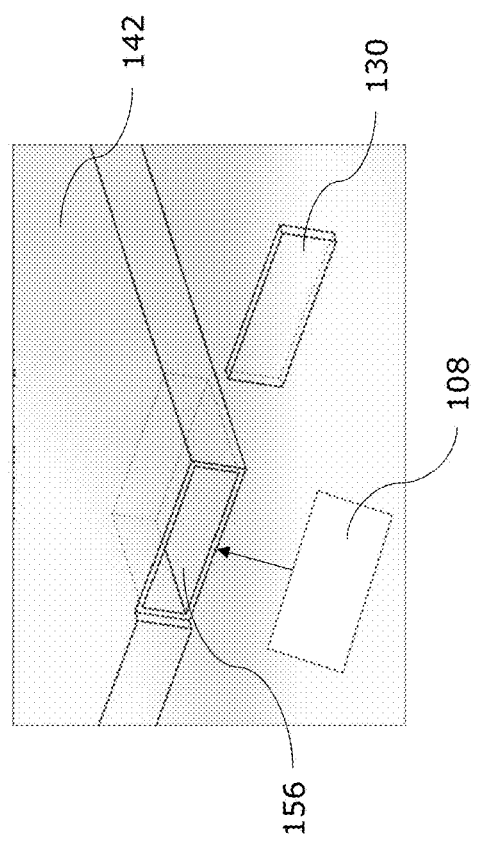

Referring now to FIGS. 7A-7B, another exemplary embodiment of thermal management system 200 additionally or optionally comprises heat spreader 142 and phase change modules 108 embedded therein. Heat spreader 142 is positioned relative to electronic component 104 (as shown in FIGS. 6A-6B) and metal frame 110, such that heat spreader 142 is in thermal contact with electronic component 104 and/or metal frame 110. In this configuration, heat spreader 142 provides a heat transfer path 144 for the heat generated by electronic component 104. In an exemplary embodiment, heat transfer path 144 is provided during the period of reduced heat dissipation or cooling (FIG. 6A). Further, heat transfer path 144 may be different from another heat transfer path during a period of standard/normal steady-state heat dissipation or cooling, such as heat transfer path 116 (FIG. 6B).

In an exemplary embodiment, as illustrated in FIG. 7B, heat spreader 142 is configured to distribute heat from a local heat source. The local heat source may comprise electronic component 104. Electronic component 104 may be disposed adjacent heat spreader 142, such that heat from electronic component 104 is provided in a centrally located region 152 of heat spreader 142. In this way, heat spreader 142 distributes heat from central region 152 and throughout an area defined by heat spreader 142. The heat distribution rate may be impacted by a heat sink surface (having a predetermined heat transfer coefficient) disposed on the opposite side of heat spreader 142.

Heat distribution rate decreases as distance from the local heat source increases, because of increased thermal resistance. In an exemplary embodiment, heat spreader 142 has a square geometry (as shown in FIG. 7B), such that four corners 150 are located at the farthest distance from centrally located region 152. Thus, the rate of heat distribution is the lowest at four corners 150, thereby making a heat transfer path through one or more or four corners 150 generally less effective heat transfer regions/paths (and therefore having lower temperature) of the heat spreader 142. It should be understood however that heat spreader 142 is not limited to a square geometry. Heat spreader 142 may include at least one location along an exterior periphery that represent(s) the farthest distance(s) from centrally located region 152 of heat spreader 142. In another exemplary embodiment, heat spreader 142 may be have a rectangular or circular geometry and phase change modules 108 can be encapsulated (as shown in FIG. 7A) along an exterior periphery of heat spreader 142 (e.g. along a peripheral rim of a circular heat spreader 142). One skilled in the art would understand from the description herein that other geometries (regular or irregular) of heat spreader 142 may depend on the design of circuit card assembly 100, or components thereof (e.g. electronic component 104).

In the exemplary embodiment shown in FIG. 7A, phase change module 108 can be encapsulated in at least one of four corners 150, where openings or pockets 156 are formed. In an exemplary embodiment, metal layer 130 may be disposed over pockets 156 for containing phase change modules 108 within pockets 156. Specifically, metal layer 130 may act as a lid or cover. Still further, in an exemplary embodiment, metal layer 130 may comprise copper and may be disposed over pockets 156 by soldering, brazing, welding or thermal epoxy. Integration of phase change modules 108 in at least one of four corners 150 does not adversely impact or at least has a neutral effect on the thermal performance of at least one heat spreader 142 during steady-state operating conditions. This is because as stated above, heat spreader 142 is less effective in terms of heat distribution rate in locations that are the farthest from the local heat source (center).

During a period of reduced cooling and/or heat dissipation period, heat spreader 142 becomes less effective (i.e. due to operating conditions such as high altitude, high gravitational force (G-force), high acceleration, hypersonic speed, intermittent peaks of computing power usage, or a combination thereof) and temperature starts to increase. Thus, another heat transfer or thermal path that is different from the heat transfer path through centrally located region 152 of heat spreader 142 becomes the primary or dominant heat transfer path, e.g. heat path 144 (FIG. 6A). Phase change modules 108 are located along this path 144. Phase change modules 108 encapsulated within heat spreader 142 start to absorb heat while keeping their temperature constant for a certain period of time. In this way, temperature fluctuations during phase transition are minimized. Additionally or optionally, decline of thermal performance during steady-state conditions are mitigated or prevented because phase change modules 108 are integrated in location(s) that are the farthest from the local heat source (center) and so less effective in heat dissipation or distribution during steady-state conditions.

Figure 8:
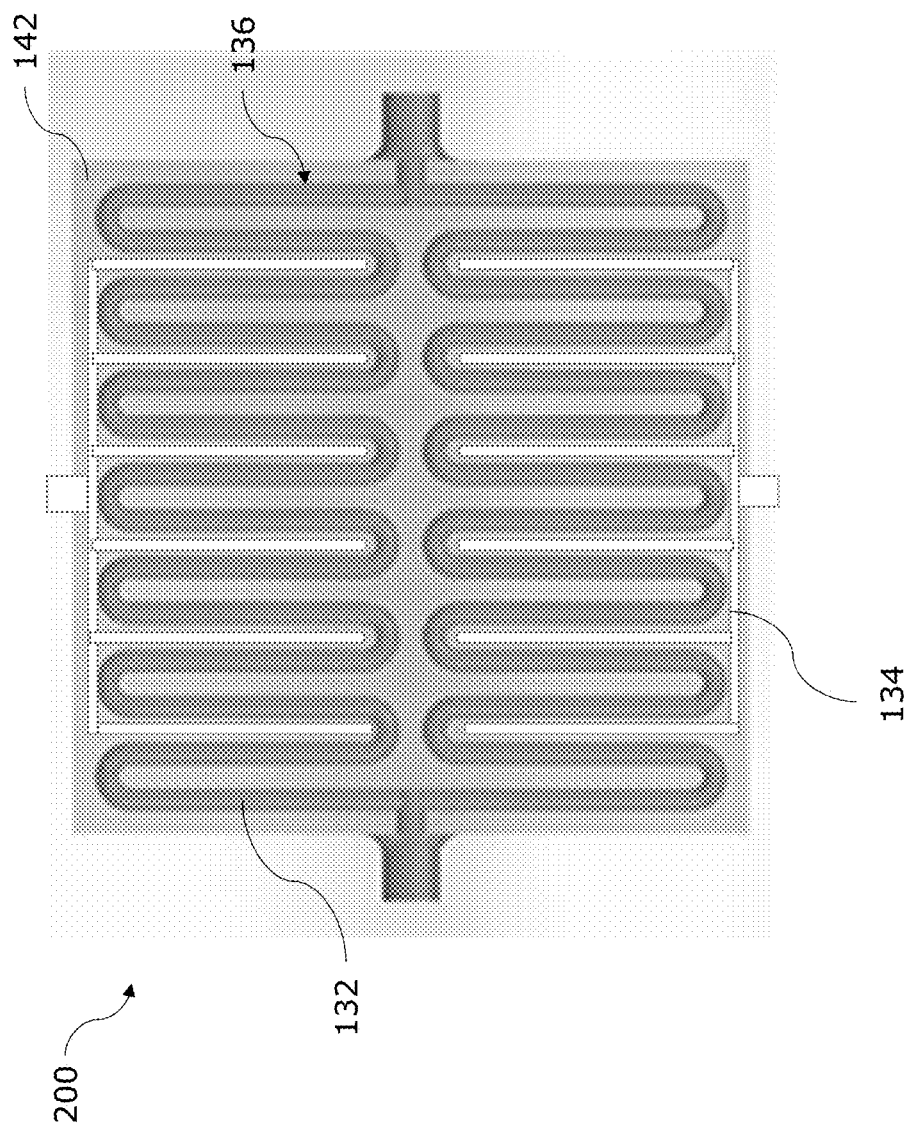
FIG. 8 depicts another embodiment of an exemplary heat transfer apparatus.

FIG. 8 shows another exemplary embodiment of thermal management system 200, in which an oscillating heat pipe, such as heat pipe 136, is embedded in heat spreader 142. As shown in FIG. 8, oscillating heat pipe 136 comprises a first plurality of channels 132 forming a first channel pattern, e.g. serpentine channel pattern. Oscillating heat pipe 136 further comprises a second plurality of channels 134 forming a second channel pattern, e.g. a serpentine channel pattern, such that the second channel pattern is formed in spaces of oscillating heat pipe 136 that are unoccupied by the first channel pattern formed by first plurality of channels 132. Material of phase change modules 108 is configured to be distributed via second plurality of channels 134 of oscillating heat pipe 136. Such distribution may be activated during the period of reduced heat dissipation or cooling. In this configuration, second plurality of channels 134 containing a phase change material like that used in phase change modules 108 do not interfere with first plurality of channels 132 containing working fluid for heat dissipation and/or cooling during normal steady-state conditions. Thus, integration of phase change material into oscillating heat pipe 136 and/or heat spreader 142 does not undesirably impact or at least has a neutral effect on heat dissipation and/or cooling during normal steady-state conditions.

Although the invention is illustrated and described herein with reference to specific embodiments, the invention is not intended to be limited to the details shown. Rather, various modifications may be made in the details within the scope and range of equivalents of the claims and without departing from the invention.

The invention claimed is:

1. A thermal management system for a heat source comprising at least one electronic component, the thermal management system comprising:
   one or more phase change modules comprising phase change material for distributing and storing heat;
   a metal frame in thermal contact with the at least one electronic component and having at least one opening for receiving the one or more phase change modules; and
   a heat transfer apparatus in thermal contact with one or more of the at least one electronic component and the metal frame, the heat transfer apparatus providing a first heat transfer path;
   wherein the one or more phase change modules is configured for distributing and storing heat during a period of reduced heat dissipation or cooling; and
   wherein the first heat transfer path is provided during the period of reduced heat dissipation or cooling and the first heat transfer path is different from a second heat transfer path during a period of standard steady-state heat dissipation or cooling.

2. The thermal management system of claim 1, wherein the heat transfer apparatus comprises at least one heat pipe disposed adjacent the metal frame, such that the one or more phase change modules embedded in the metal frame is disposed above, below, on one or more sides of the at least one heat pipe, or a combination thereof.

3. The thermal management system of claim 2, wherein the heat transfer apparatus comprises at least one heat spreader that is disposed adjacent the at least one electronic component.

4. The thermal management system of claim 3, wherein the heat transfer apparatus comprises an oscillating heat pipe having a first plurality of channels embedded in the at least one heat spreader and forming a first channel pattern.

5. The thermal management system of claim 4, wherein the oscillating heat pipe further comprises a second plurality of channels forming a second channel pattern, such that the second channel pattern is formed in spaces that are unoccupied by the first channel pattern.

6. The thermal management system of claim 5, wherein the second plurality of channels are configured to receive the one or more phase change modules.

7. The thermal management system of claim 3, further comprising a metal layer for containing the one or more phase change modules within the at least one opening of the metal frame.

8. The thermal management system of claim 7, wherein the metal layer comprises copper and is disposed over the at least one opening of the metal frame by soldering, brazing, welding, or thermal epoxy.

9. The thermal management system of claim 7, wherein the at least one opening of the metal frame comprises a pocket.

10. The thermal management system of claim 9, wherein the at least one opening of the metal frame comprises a T-shaped pocket, the T-shaped pocket having a pair of ledges to receive the metal layer.

11. The thermal management system of claim 1, wherein the metal frame comprises aluminum, copper, or alloys thereof.

12. The thermal management system of claim 1, wherein the period of reduced heat dissipation or cooling is due to operating conditions comprising one of high altitude, high acceleration, hypersonic speed, intermittent peaks of computing power usage, or a combination thereof.

13. The thermal management system of claim 1, wherein the metal frame is in direct thermal contact with the at least one electronic component comprising a printed circuit board (PCB) and the heat transfer apparatus is in direct thermal contact with one or more of the at least one electronic component and the metal frame.

14. A circuit card assembly comprising:
a circuit board having at least one electronic component that generates heat;
one or more phase change modules comprising phase change materials for distributing and storing heat;
a metal frame coupled to the circuit board and in thermal contact with the at least one electronic component, the metal frame further having at least one opening for receiving the one or more phase change modules; and
a heat transfer apparatus in thermal contact with one or more of the at least one electronic component and the metal frame, the heat transfer apparatus providing a first heat transfer path;
wherein the one or more phase change modules is configured for distributing and storing heat during a period of reduced heat dissipation or cooling; and
wherein the first heat transfer path is provided during the period of reduced heat dissipation or cooling and the first heat transfer path is different from a second heat transfer path during a period of standard steady-state heat dissipation or cooling.

15. The circuit card assembly of claim 14, wherein the heat transfer apparatus comprises at least one heat pipe disposed adjacent the metal frame, such that the one or more phase change modules embedded in the metal frame is disposed above, below, on one or more sides of the at least one heat pipe, or a combination thereof.

16. The circuit card assembly of claim 15, wherein the heat transfer apparatus comprises at least one heat spreader that is disposed adjacent the at least one electronic component.

17. The circuit card assembly of claim 16, wherein the heat transfer apparatus comprises an oscillating heat pipe having a first plurality of channels embedded in the at least one heat spreader and forming a first channel pattern.

18. The circuit card assembly of claim 17, wherein the oscillating heat pipe further comprises a second plurality of channels forming a second channel pattern, such that the second channel pattern is formed in spaces that are unoccupied by the first channel pattern.

19. The circuit card assembly of claim 18, wherein the second plurality of channels are configured to receive the one or more phase change modules.

20. The circuit card assembly of claim 16, further comprising a metal layer for containing the one or more phase change modules within the at least one opening of the metal frame.

21. The circuit card assembly of claim 20, wherein the metal layer comprises copper and is disposed over one or more of the at least one opening of the metal frame by soldering, brazing, welding, or thermal epoxy.

22. The circuit card assembly of claim 20, wherein the at least one opening of the metal frame comprises a pocket.

23. The circuit card assembly of claim 22, wherein the at least one opening of the metal frame comprises a T-shaped pocket, the T-shaped pocket having a pair of ledges to receive the metal layer.

24. The circuit card assembly of claim 14, wherein the metal frame comprises aluminum, copper, or alloys thereof.

25. The circuit card assembly of claim 14, wherein the period of reduced heat dissipation or cooling is due to operating conditions comprising one of high altitude, high acceleration, hypersonic speed, intermittent peaks of computing power usage, or a combination thereof.

26. The circuit card assembly of claim 14, wherein the metal frame is in direct thermal contact with the at least one electronic component comprising a printed circuit board (PCB) and the heat transfer apparatus is in direct thermal contact with one or more of the at least one electronic component and the metal frame.

27. A method of manufacturing a circuit card assembly comprising at least one electronic component that generates heat, the method comprising:
(a) forming at least one opening in a metal frame for receiving the at least one electronic component;
(b) forming at least one opening in the metal frame for receiving one or more phase change modules, the one or more phase change modules comprising phase change material for distributing and storing heat;
(c) filling the at least one opening with the one or more phase change modules;
(d) attaching a metal layer over the at least one opening for containing the one or more phase change modules within the at least one opening of the metal frame, the one or more phase change modules being configured for distributing and storing heat during a period of reduced heat dissipation or cooling;
(e) forming at least one groove in the metal frame for contacting a surface of a heat transfer apparatus, such that the heat transfer apparatus is in thermal contact with one or more of the at least one electronic component comprising a printed circuit board and the metal frame, the heat transfer apparatus further providing a first heat transfer path, the first heat transfer path being provided during the period of reduced heat dissipation or cooling and the first heat transfer path being different from a second heat transfer path during a period of standard steady-state heat dissipation or cooling.

28. The method of claim 27, wherein the heat transfer apparatus comprises at least one heat pipe, the at least one heat pipe disposed at least partially within the groove, such that the one or more phase change modules embedded in the metal frame is disposed above, below, on one or more sides of the at least one heat pipe, or a combination thereof.

29. The method of claim 27, wherein the at least one opening of the metal frame comprises a T-shaped pocket, the T-shaped pocket having a pair of ledges to receive the metal layer.

30. The method of claim 27, wherein the heat transfer apparatus is in direct thermal contact with one or more of the at least one electronic component comprising a printed circuit board and the metal frame.

* * * * *